(12) United States Patent
Doi et al.

(10) Patent No.: US 7,671,775 B2
(45) Date of Patent: Mar. 2, 2010

(54) DIGITAL-TO-ANALOG CONVERTER

(75) Inventors: Yasuyuki Doi, Kyoto (JP); Kurumi Nakayama, Osaka (JP); Makoto Hattori, Kyoto (JP); Hideki Ikeda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/236,038

(22) Filed: Sep. 23, 2008

(65) Prior Publication Data

US 2009/0184856 A1     Jul. 23, 2009

(30) Foreign Application Priority Data

Jan. 17, 2008    (JP)    ............. 2008-007957

(51) Int. Cl.
    *H03M 1/66*    (2006.01)
(52) U.S. Cl. .................. 341/145; 341/148; 341/154
(58) Field of Classification Search .......... 341/145, 341/148, 154
    See application file for complete search history.

(56) References Cited

U.S. PATENT DOCUMENTS

| | | | | |
|---|---|---|---|---|
| 5,877,717 A | * | 3/1999 | Tu et al. .................. 341/150 |
| 5,969,657 A | * | 10/1999 | Dempsey et al. ........... 341/145 |
| 6,225,931 B1 | * | 5/2001 | Rao et al. .................. 341/144 |
| 6,373,419 B1 | | 4/2002 | Nakao |
| 6,441,763 B1 | * | 8/2002 | Nakao ........................ 341/154 |
| 7,423,572 B2 | * | 9/2008 | Nakayama et al. .......... 341/145 |
| 2006/0001627 A1 | | 1/2006 | Murata |
| 2007/0176813 A1 | | 8/2007 | Nakayama et al. |

\* cited by examiner

*Primary Examiner*—Khai M Nguyen
(74) *Attorney, Agent, or Firm*—McDermott Will & Emery LLP

(57) ABSTRACT

A converter of 6-bit input includes a reference voltage generating circuit generating 17 reference voltages, a first switch circuit having 19 switch pairs each including MOS transistors for selecting two adjacent reference voltages in accordance with the four most significant bits, a second switch circuit including a series circuit of MOS transistors for dividing the selected two reference voltages into four to obtain three intermediate voltages, and a third switch circuit for selectively outputting the lower of the selected two reference voltages or one of the three intermediate voltages. In a second mode in which a gray level having a smaller ON-resistance of a MOS transistor than that in the first mode is selected, the number of MOS transistors used in the first and second switch circuits for voltage division is increased.

11 Claims, 7 Drawing Sheets

| CONTROL SIGNAL | | T3 | T2 | T1 | T0 |
|---|---|---|---|---|---|
| bit3 | bit2 | | | | |
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

FIG. 2

FIG. 3 bit5=0

| CONTROL SIGNAL | | SW2 | | | | SW3 | | | | Vout |
|---|---|---|---|---|---|---|---|---|---|---|
| bit1 | bit0 | M00 | M01 | M02 | M03 | M04 | M05 | M06 | M07 | |
| 0 | 0 | ※ | ※ | ※ | ※ | ON | OFF | OFF | OFF | Vn00=Vin1 |
| 0 | 1 | ON | ON | ON | ON | OFF | ON | OFF | OFF | Vn01=Vin1+(Vin2−Vin1)/4 |
| 1 | 0 | ON | ON | ON | ON | OFF | OFF | ON | OFF | Vn02=Vin1+(Vin2−Vin1)/2 |
| 1 | 1 | ON | ON | ON | ON | OFF | OFF | OFF | ON | Vn03=Vin1+3(Vin2−Vin1)/4 |

Vin1, Vin2: two adjacent voltages of V0 to V32
At least one of ※s is OFF
M00' to M07' are all OFF

FIG. 4 bit5=1

| CONTROL SIGNAL | | SW2 | | | | | | | | SW3 | | | | | | | | Vout |
|---|---|---|---|---|---|---|---|---|---|---|---|---|---|---|---|---|---|---|
| bit1 | bit0 | M00 | M01 | M02 | M03 | M00' | M01' | M02' | M03' | M04 | M05 | M06 | M07 | M04' | M05' | M06' | M07' | |
| 0 | 0 | OFF | OFF | OFF | OFF | OFF | OFF | OFF | OFF | ON | OFF | OFF | OFF | OFF | OFF | OFF | OFF | Vn00' = Vin1 |
| 0 | 1 | OFF | ON | ON | OFF | ON | ON | ON | ON | OFF | OFF | OFF | OFF | OFF | ON | OFF | OFF | Vn01' = Vin1 + (Vin2 − Vin1)/4 |
| 1 | 0 | OFF | ON | ON | OFF | ON | ON | ON | ON | OFF | OFF | OFF | OFF | OFF | OFF | ON | OFF | Vn02' = Vin1 + (Vin2 − Vin1)/2 |
| 1 | 1 | OFF | ON | ON | OFF | ON | ON | ON | ON | OFF | OFF | OFF | OFF | OFF | OFF | OFF | ON | Vn03' = Vin1 + 3(Vin2 − Vin1)/4 |

Vin1, Vin2: two adjacent voltages of V32 to V64

FIG. 5

| CONTROL SIGNAL | | | | | | Vin1 | Vin2 | Vout |
|---|---|---|---|---|---|---|---|---|
| bit5 | bit4 | bit3 | bit2 | bit1 | bit0 | | | |
| 0 | 0 | 0 | 0 | 0 | 0 | V0 | V4 | V0 |
| 0 | 0 | 0 | 0 | 0 | 1 | V0 | V4 | V1 |
| 0 | 0 | 0 | 0 | 1 | 0 | V0 | V4 | V2 |
| 0 | 0 | 0 | 0 | 1 | 1 | V0 | V4 | V3 |
| 0 | 0 | 0 | 1 | 0 | 0 | V4 | V8 | V4 |
| 0 | 0 | 0 | 1 | 0 | 1 | V4 | V8 | V5 |
| 0 | 0 | 0 | 1 | 1 | 0 | V4 | V8 | V6 |
| 0 | 0 | 0 | 1 | 1 | 1 | V4 | V8 | V7 |
| ... | ... | ... | ... | ... | ... | ... | ... | ... |
| 1 | 1 | 1 | 0 | 1 | 1 | V56 | V60 | V56 |
| 1 | 1 | 1 | 0 | 0 | 0 | V56 | V60 | V57 |
| 1 | 1 | 1 | 0 | 0 | 1 | V56 | V60 | V58 |
| 1 | 1 | 1 | 0 | 1 | 0 | V56 | V60 | V59 |
| 1 | 1 | 1 | 1 | 0 | 0 | V60 | V64 | V60 |
| 1 | 1 | 1 | 1 | 0 | 1 | V60 | V64 | V61 |
| 1 | 1 | 1 | 1 | 1 | 0 | V60 | V64 | V62 |
| 1 | 1 | 1 | 1 | 1 | 1 | V60 | V64 | V63 |

DIGITAL-TO-ANALOG CONVERTER

BACKGROUND OF THE INVENTION

1. Field of the Invention

The present invention relates to a digital-to-analog converter (DAC), and more particularly, to a DAC suitably used in an image display device, such as a liquid crystal display or the like.

2. Description of the Related Art

There is a known conventional DAC for a liquid crystal display that has a reference voltage generating circuit, a selection circuit having a plurality of pairs of switches, and a voltage follower. Specifically, when the DAC receives a 6-bit digital signal as an input code, the reference voltage generating circuit, which includes 32 resistors connected in series, supplies 33 different reference voltages to the selection circuit from the terminals of the resistors. The selection circuit includes 37 switch pairs each of which selects one of two inputs in accordance with a corresponding bit of the input code. The selection circuit selects two adjacent reference voltages of the 33 reference voltages when the input code is an odd number, and one reference voltage of the 33 reference voltages redundantly when the input code is an even number, and outputs the selected voltage or voltages to the voltage follower. The voltage follower outputs an average value of two supplied voltages as an analog signal. In other words, when the input code is an odd number, an intermediate voltage between two adjacent reference voltages is generated as a gray-level voltage by the voltage follower (see U.S. Pat. No. 6,373,419).

In this DAC, as the number of input bits (resolution) is increased from 6 to 8 to 10, the number of reference voltages to be generated rapidly increases from 33 to 129 to 513, and the number of switch pairs required for the selection circuit rapidly increases from 37 to 135 to 521. Therefore, the chip size of the DAC is unavoidably increased as the definition level and the number of gray levels of a liquid crystal display is currently increased.

To avoid this, a DAC has been developed in which two adjacent reference voltages are selected and a difference between the two reference voltages is divided by utilizing an ON-resistance of a Metal-Oxide-Semiconductor (MOS) transistor to obtain a desired intermediate gray-level voltage (see US Patent Application Publication No. 2007/0176813).

SUMMARY OF THE INVENTION

When the DAC that utilizes the ON-resistance of a MOS transistor is employed for a liquid crystal display, a reference voltage generating circuit including a resistor string is shared by a large number of DACs. Therefore, when a plurality of DACs select the same pair of two reference voltages and divide a voltage, the MOS transistors (on-state) of the DACs are connected in parallel to a specific resistor in the reference voltage generating circuit. In this case, current shunt occurs, so that a reference voltage itself generated in the reference voltage generating circuit is shifted.

The voltage shift may be suppressed by increasing the combined ON-resistance of the MOS transistors that are used to divide a voltage. To achieve this, for example, the number of MOS transistors may be increased, the gate length of each MOS transistor may be increased, or the like. However, if the combined ON-resistance is increased, the settling time of the DAC becomes long, so that a desired gray-level voltage cannot be output within a predetermined time.

An object of the present invention is to reduce the number of elements constituting a DAC while maintaining the same settling time and the same resolution.

In the present invention, attention is paid to the fact that the ON-resistance of a MOS transistor varies depending on the magnitudes of two reference voltages to be divided. Specifically, in the case of a P-channel MOS transistor, the ON-resistance is smaller when a voltage near a power supply voltage is to be divided. In the case of an N-channel MOS transistor, the ON-resistance is smaller when a voltage near a ground voltage is to be divided. In either case, this is because a gate-source voltage Vgs is larger.

Therefore, according to the present invention, a circuit configuration is employed in which the number of MOS transistors can be switched between a small number for a gray level having a large ON-resistance and a large number for a gray level having a small ON-resistance. Thereby, the voltage shift can be suppressed without deteriorating the settling time.

Specifically, the present invention provides a converter for converting an N-bit digital signal (N is an integer of three or more) into an analog signal using a plurality of different reference voltages, including a selection voltage divider circuit, a mode selection circuit, and an output circuit described as follows. The selection voltage divider circuit has a plurality of MOS transistors each functioning as a switch. The selection voltage divider circuit selects two of the plurality of reference voltages via respective sets of MOS transistors of the plurality of MOS transistors, the sets having the same number of MOS transistors, in accordance with the (N−m) most significant bits of the digital signal, and divides a difference between the two selected reference voltages into M by combined ON-resistances of M MOS transistor groups connected in series of the plurality of MOS transistors to obtain (M−1) intermediate voltages, where m is an integer of one or more and M is an integer of $2^m$ to $2^{m-1}+1$. The mode selection circuit determines a magnitude of the combined ON-resistance of each of the M MOS transistor groups of the selection voltage divider circuit, selects a first mode when the combined ON-resistance is large and a second mode when the combined ON-resistance is small, and performs a control so that the number of MOS transistors included in each of the M MOS transistor groups in the selection voltage divider circuit is larger in the second mode than in the first mode. The output circuit selectively outputs one of the two selected reference voltages or one of the (M−1) intermediate voltages as the analog signal in accordance with the m least significant bits of the digital signal.

In this case, a reference voltage generating circuit has $2^{N-m}$ resistors connected in series, and supplies ($2^{N-m}+1$) different reference voltages from terminals of the resistors to the selection voltage divider circuit.

When the selection voltage divider circuit has a switch circuit for selecting two adjacent reference voltages from the plurality of reference voltages, the switch circuit has a plurality of switch pairs, for example. Each of the plurality of switch pairs selects one of two inputs in accordance with a corresponding bit of the (N−m) most significant bits of the digital signal. The number $a_n$ of switch pairs corresponding to the n-th bit counted from the least significant bit of the (N−m) most significant bits of the digital signal is represented by:

$$a_1=2, a_{n-1}+2^{n-2} (2 \leq n \leq N-m).$$

The two adjacent reference voltages are selected via (N−m) of MOS transistors included in the plurality of switch pairs. In this case, each of the M MOS transistor groups in the selection voltage divider circuit has (N−m+1) or more MOS transistors connected in series. Two of the M MOS transistor groups each include the (N−m) MOS transistors for selecting the two adjacent reference voltages, in the (N−m+1) or more MOS transistors connected in series.

When the selection voltage divider circuit has a switch circuit for selecting two adjacent reference circuit from the plurality of reference voltages, the selection voltage divider circuit further has a decoding circuit for decoding P least significant bits of the (N−m) most significant bits of the digital signal into $2^P$ selection signals any one of which is valid, where P is an integer of 2 or more and (N−m) or less. The switch circuit has $2^P$ switch pairs each for selectively transferring two inputs to two outputs in accordance with a corresponding one of the $2^P$ selection signals, and a plurality of other switch pairs each for selecting one of two inputs in accordance with a corresponding one of the (N−m−P) most significant bits of the digital signal. The two adjacent reference voltages are each selected via (N−m−P+1) of MOS transistors included in all the switch pairs. In this case, each of the M MOS transistor groups of the selection voltage divider circuit has (N−m−P+2) or more MOS transistors connected in series, for example. Two of the M MOS transistor groups each include (N−m−P+1) MOS transistors for selecting the two adjacent reference voltages in the (N−m−P+2) or more MOS transistors connected in series.

According to the present invention, the number of elements included in a DAC can be reduced while maintaining the same resolution without deteriorating the settling time of the DAC.

DETAILED DESCRIPTION OF THE PREFERRED EMBODIMENTS

Hereinafter, a best mode for carrying out the present invention will be described with reference to the accompanying drawings.

Figure 1:
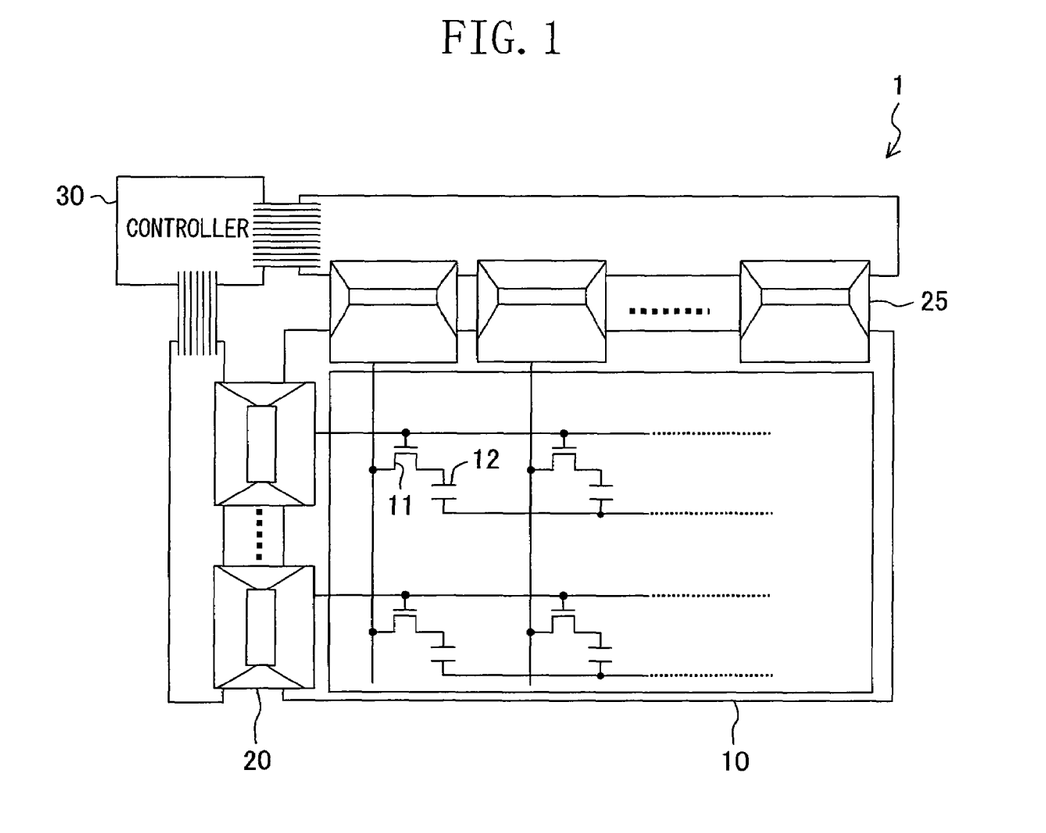
FIG. 1 is a plan view schematically showing an image display device employing a DAC according to the present invention.

FIG. 1 is a plan view schematically showing an image display device employing a DAC according to the present invention. The image display device 1 of FIG. 1 is a liquid crystal display comprising a liquid crystal display panel 10 having a plurality of pixels arranged in a matrix, a plurality of gate drivers 20, a plurality of source drivers 25, and a controller 30 for controlling the gate drivers 20 and the source drivers 25. Each pixel of the liquid crystal display panel 10 has a Thin Film Transistor (TFT) 11 and a pixel capacitance 12 connected to the drain of the TFT 11. The gates of TFTs 11 in pixels belonging to the same row are driven by their common gate driver 20. The sources of the TFT 11 in pixels belonging to the same column are driven by their common source driver 25. All the source drivers 25 constitute a liquid crystal drive circuit for driving a plurality of pixels in accordance with a digital signal representing a gray level of an image transmitted from the controller 30. Each source driver 25 includes a DAC for converting a digital signal into an analog signal for each pixel column. In other words, the image display device 1 includes the same number of DACs as that of pixel columns.

Figure 2:
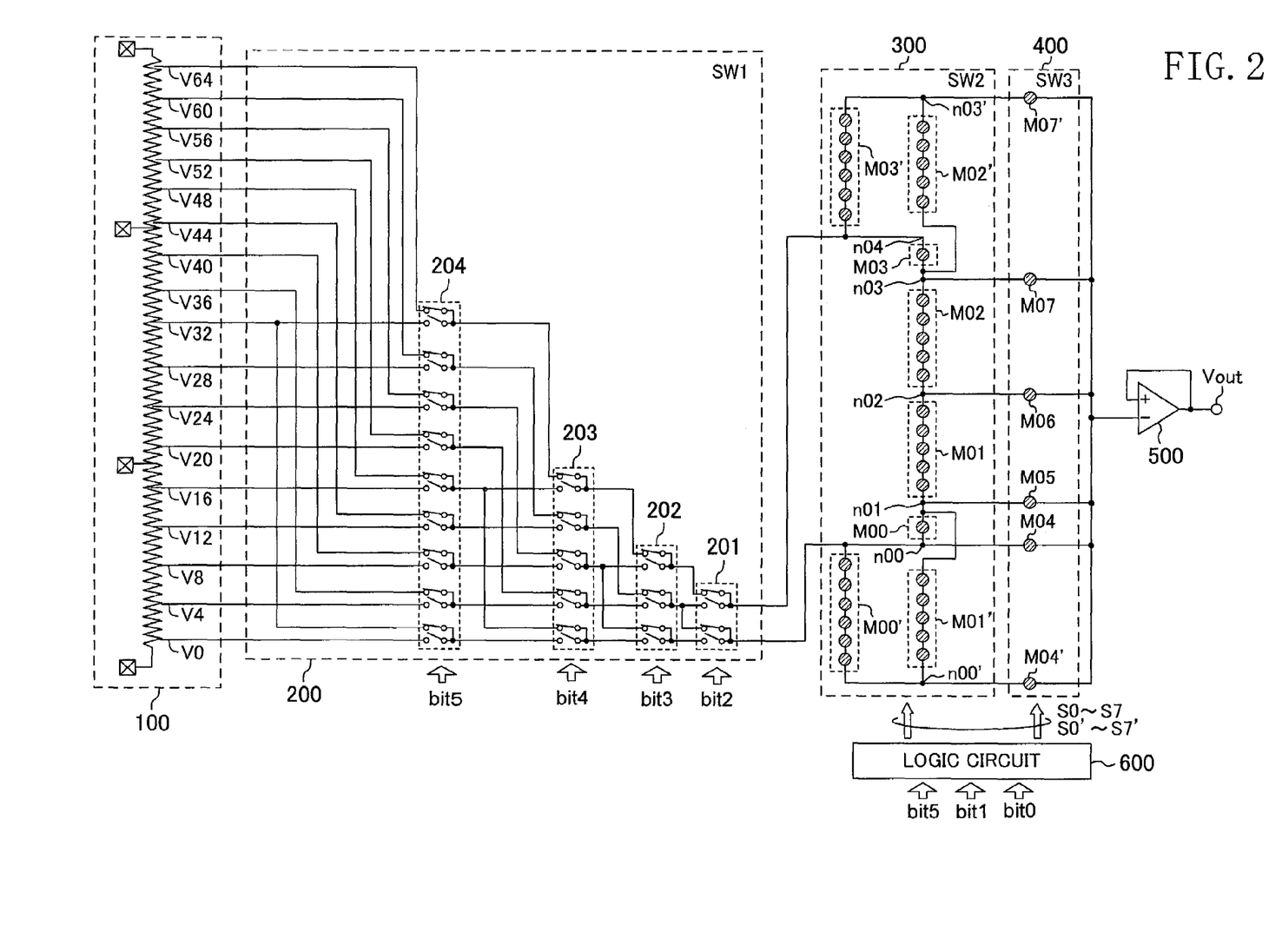
FIG. 2 is a circuit diagram showing an exemplary configuration of the DAC of the present invention.

FIG. 2 shows an exemplary configuration of the DAC of the present invention. The DAC of FIG. 2 is a converter for converting a digital signal represented by six bits bit5 to bit0 into an analog signal Vout. The DAC comprises a reference voltage generating circuit 100, a first switch circuit (SW1) 200, a second switch circuit (SW2) 300, a third switch circuit (SW3) 400, a voltage follower 500, and a logic circuit 600.

The reference voltage generating circuit 100 is a resistance voltage divider circuit including 16 ($=2^{6-2}$) resistors connected in series, which supplies 17 different reference voltages V0, V4, V8, ..., and V64 from the terminals of the resistors to the first switch circuit 200.

The first switch circuit 200 is a circuit for selecting two adjacent reference voltages (hereinafter the lower one is represented by Vin1 and the higher one is represented by Vin2) of the 17 reference voltages V0 to V64, which receives the four most significant bits bit5 to bit2 of the 6-bit signal as a control signal. In FIG. 2, 201 indicates two switch pairs whose ON/OFF is controlled by bit2. 202 indicates 3 ($=2+2^{2-2}$) switch pairs whose ON/OFF is controlled by bit3. 203 indicates 5 ($=3+2^{3-2}$) switch pairs whose ON/OFF is controlled by bit4. 204 indicates 9 ($=5+2^{4-2}$) switch pairs whose ON/OFF is controlled by bit5. As described above, the first switch circuit 200 includes 19 two-input one-output switch pairs each of which selects one of two inputs in accordance with a corresponding one of bit5 to bit2. Each switch pair selects the lower input when the corresponding bit is 0 and the upper input when the corresponding bit is 1.

Note that the two switches included in each switch pair of the first switch circuit 200 each include an N-channel MOS transistor or a P-channel MOS transistor, or a transfer gate including an N-channel MOS transistor and a P-channel MOS transistor connected to each other. It is hereafter assumed that each switch includes a P-channel MOS transistor (hereinafter simply referred to as a MOS transistor).

For example, if the four bits bit5 to bit2 are "0000", the lowest reference voltage V0 is connected via 4 ($=6-2$) MOS transistors to the second switch circuit 300, and the second lowest reference voltage V4 is connected via another 4 ($=6-2$) MOS transistors to the second switch circuit 300. In this case, Vin1=V0 and Vin2=V4. If the four bits bit5 to bit2 are "0001", the reference voltage V4 is connected via four MOS transistors to the second switch circuit 300, and the next higher reference voltage V8 is connected via another four MOS transistors to the second switch circuit 300. In this case, Vin1=V4 and Vin2=V8. If the four bits bit5 to bit2 are "1111", the reference voltage V60 is connected via four MOS transistors to the second switch circuit 300, and the highest reference voltage V64 is connected via another four MOS transistors to the second switch circuit 300. In this case, Vin1=V60 and Vin2=V64.

Forty circles shown in the second switch circuit 300 and the third switch circuit 400 each indicate an N-channel MOS transistor or a P-channel MOS transistor, or a transfer gate including an N-channel MOS transistor and a P-channel MOS transistor connected to each other, which function as a switch. Note that it is hereafter assumed that each switch includes a P-channel MOS transistor (hereinafter simply referred to as a MOS transistor).

The second switch circuit 300 has a MOS transistor M00 connected between a node n00 and a node n01, 5 (=6−2+1) MOS transistors M01 connected in series between the node n01 and a node n02, 5 (32 6−2+1) MOS transistors M02 connected in series between the node n02 and a node n03, and a MOS transistor M03 connected between the node n03 and a node n04. The voltage Vin1 that is the lower of the two reference voltages selected by the first switch circuit 200 is connected to the node n00, and the higher voltage Vin2 is connected to the node n04. Therefore, for example, if the four bits bit5 to bit2 are "0000" and M00, M0, M02 and M03 are all ON, a group of five on-state MOS transistors is interposed between the reference voltage V0 and the node n01, between the node n01 and the node n02, between the node n02 and the node n03, and between the node n03 and the reference voltage V4. The combined ON-resistances of the four MOS transistor groups connected in series divide the difference between V0 and V4 into four, resulting in three intermediate voltages. Note that the MOS transistor group between the reference voltage V0 and the node n01 includes four MOS transistors of the first switch circuit 200, and the MOS transistor group between the node n03 and the reference voltage V4 includes another four MOS transistors of the first switch circuit 200.

In addition, if the twenty MOS transistors included in the four MOS transistor groups all have the same size, the combined ON-resistances of the four MOS transistor groups are equal to each other. In this case, an intermediate voltage V0+(V4−V0)/4 is obtained at the node n01, an intermediate voltage V0+(V4−V0)/2 is obtained at the node n02, and an intermediate voltage V0+3(V4−V0)/4 is obtained at the node n03. Note that when the voltage of the node n00 is desired to be the reference voltage V0, at least one of M00, M01, M02 and M03 is turned OFF to stop the flow of a current through the four MOS transistor groups connected in series.

The second switch circuit 300 further has 6 (=6−2+2) MOS transistors M00' connected between the node n00 and a node n00', 5 (=6−2+1) MOS transistors M01' connected between the node n00' and the node n01, 5 (=6−2+1) MOS transistors M02' connected between the node n03 and a node n03', and 6 (=6−2+2) MOS transistors M03' connected between the node n03' and the node n04. Therefore, for example, when the four bits bit5 to bit2 are "1111" and M00', M01', M01, M02, M02' and M03' are all ON and M00 and M03 are OFF, a group of ten on-state MOS transistors is interposed between the reference voltage V60 and the node n00', between the node n01' and node n02, between the node n02 and the node n03', and between the node n03' and the reference voltage V64. The difference between V60 and V64 is divided into four by the combined ON-resistances of the four MOS transistor groups connected in series, resulting in three intermediate voltages. Note that the MOS transistor group between the reference voltage V60 and the node n00' includes four MOS transistors of the first switch circuit 200, and the MOS transistor group between the node n03' and the reference voltage V64 includes another four MOS transistors of the first switch circuit 200.

In addition, if forty MOS transistors included in the four MOS transistor groups all have the same size, the combined ON-resistances of the four MOS transistor groups are equal to each other. In this case, an intermediate voltage V60+(V64−V60)/4 is obtained at the node n00', an intermediate voltage V60+(V64−V60)/2 is obtained at the node n02, and an intermediate voltage V60+3(V64−V60)/4 is obtained at the node n03'. Note that when the voltage of the node n00 is desired to be the reference voltage V60, at least one of M00, M01, M02 and M03 is turned OFF and at least one of M00', M01', M02' and M03' is turned OFF to stop the flow of a current through the four MOS transistor groups connected in series.

The third switch circuit 400 comprises a MOS transistor M04 connected between the node n00 and an input node of the voltage follower 500, a MOS transistor M05 connected between the node n01 and the input node of the voltage follower 500, a MOS transistor M06 connected between the node n02 and the input node of the voltage follower 500, a MOS transistor M07 connected between the node n03 and the input node of the voltage follower 500, a MOS transistor M04' connected between the node n00' and the input node of the voltage follower 500, and a MOS transistor M07' connected between the node n03' and the input node of the voltage follower 500.

The logic circuit 600 generates signals S0 to S7 and S0' to S7' for controlling the second and third switch circuits 300 and 400 in accordance with the two least significant bits bit1 and bit0 and the most significant bit (bit5) of the 6-bit signal. As a result, the third switch circuit 400 selects the voltage of any one of the six nodes n00, n01, n02, n03, n00' and n03' in accordance with bit1, bit0 and bit5, and supplies the selected node voltage to the voltage follower 500. The voltage thus selected by the third switch circuit 400 is output as the analog signal Vout from the voltage follower 500.

Figure 3:
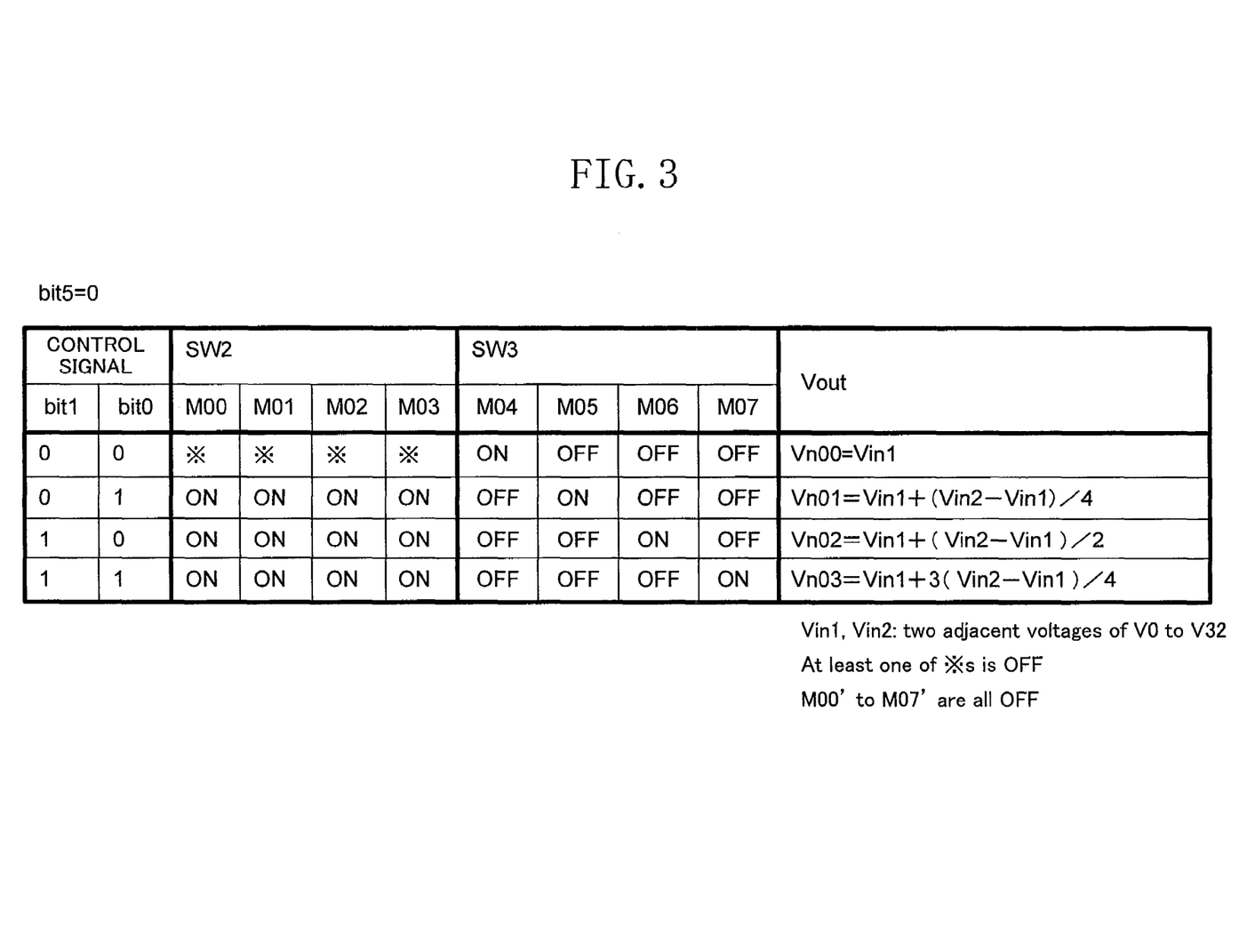
FIG. 3 is a diagram showing a first mode operation of a second and a third switch circuit of FIG. 2.
Figure 4:
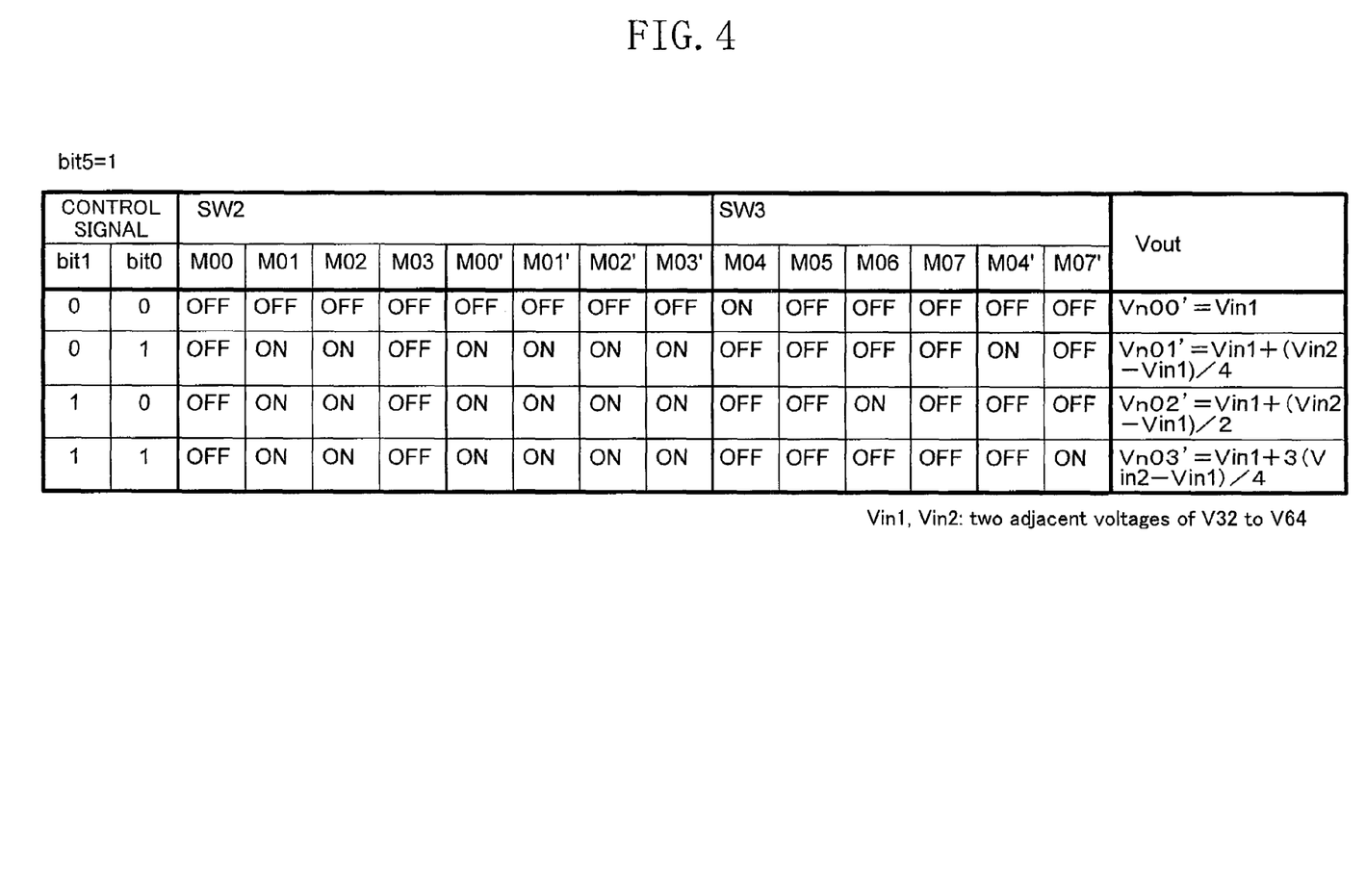
FIG. 4 is a diagram showing a second mode operation of the second and third switch circuits of FIG. 2.
Figure 5:
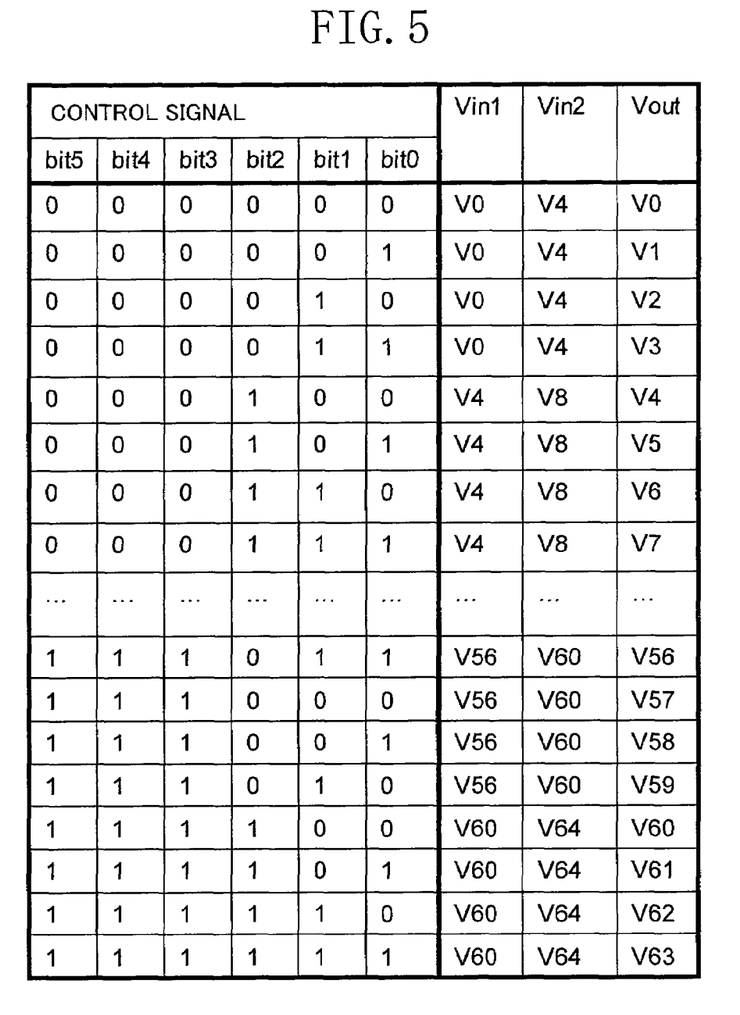
FIG. 5 is a diagram showing a whole operation of the DAC of FIG. 2.

FIGS. 3 and 4 show operations of the second and third switch circuits 300 and 400 of FIG. 2, and FIG. 5 shows a whole operation of the DAC of FIG. 2. By the logic circuit 600, a first mode operation of FIG. 3 is selected when bit5=0, and a second mode operation of FIG. 4 is selected when bit5=1. Vn00, Vn01, Vn02 and Vn03 in FIG. 3 indicate the voltages of the nodes n00, n01, n02 and n03, respectively, and Vn00', Vn01', Vn02' and Vn03' of FIG. 4 indicate the voltages of the node n00, n00', n02 and n03', respectively. In the second switch circuit 300, when bit5 is 0, M01, M02 and M03 may be invariably set to be ON and ON/OFF of only M00 may be controlled by a 2-bit signal including bit1 and bit0, for example. If M05 and M07 have the same size, the difference between Vn01 and Vn03 can be divided into two by the ON-resistance of M05 and M07, instead of selection of Vn02 by M06, to generate an intermediate voltage (corresponding to Vn02) between Vn01 and Vn03. V1, V2, V3, V5, V6, V7 and the like in FIG. 5 indicate intermediate voltages generated by the first and second switch circuits 200 and 300.

Figure 6:
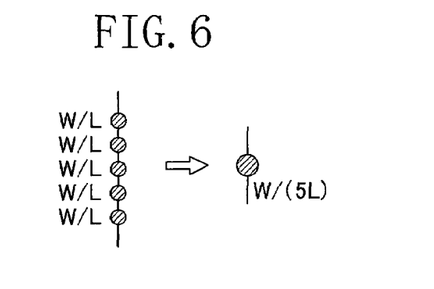
FIG. 6 is a diagram showing a variation of the second switch circuit of FIG. 2.

FIG. 6 shows a variation of the second switch circuit 300 of FIG. 2. Here, a size of a MOS transistor is represented by the ratio "W/L" of a gate width W and a gate length L of the MOS transistor. For example, if the five MOS transistors included in M01 of FIG. 2 each have the size W/L, the series circuit of the five MOS transistors can be replaced with a single MOS transistor. Note that the single MOS transistor has a size of W/(5L) and has an ON-resistance equal to the combined ON-resistance of the series circuit including the five MOS transistors. Similar replacement can be applied to the five MOS transistors included in M02 of FIG. 2 and the like.

As described above, according to the DAC of FIG. 2, the first and second switch circuits 200 and 300 operate as a selection voltage divider circuit. Therefore, when the number of input bits is 6, the number of reference voltages to be generated is 17 and the number of switch pairs required for the first switch circuit 200 operating as a selection circuit is 19. Therefore, the number of elements included in the DAC can be reduced while maintaining the same resolution, as compared to the conventional DAC described above, even when the number of elements required for the second and third switch circuits 300 and 400 and the logic circuit 600 are taken into consideration. This effect is further enhanced as the number of input bits (resolution) is increased from 6 to 8 to 10 to 12.

In addition, the logic circuit 600 determines the magnitude of the combined ON-resistance of each of the four MOS transistor groups based on the most significant bit (bit5) of the 6-bit signal. When bit5=0 and the combined ON-resistance is large, the first mode operation of FIG. 3 is selected, and when bit5=1 and the combined ON-resistance is small, the second mode operation of FIG. 4 is selected. Thereby, the voltage shift can be suppressed without deteriorating the settling time.

Note that when each switch of FIG. 2 includes an N-channel MOS transistor, the first mode operation of FIG. 3 may be selected if bit5=1, and the second mode operation of FIG. 4 may be selected if bit5=0.

The number of MOS transistors used for voltage division may be changed in three or more steps. The number of divisions may be changed, depending on a gray level voltage to be output. For example, the number of divisions is two for a gray level voltage for a small ON-resistance of a MOS transistor, and the number of divisions is four for a gray level voltage for a large ON-resistance of a MOS transistor.

Figure 7:
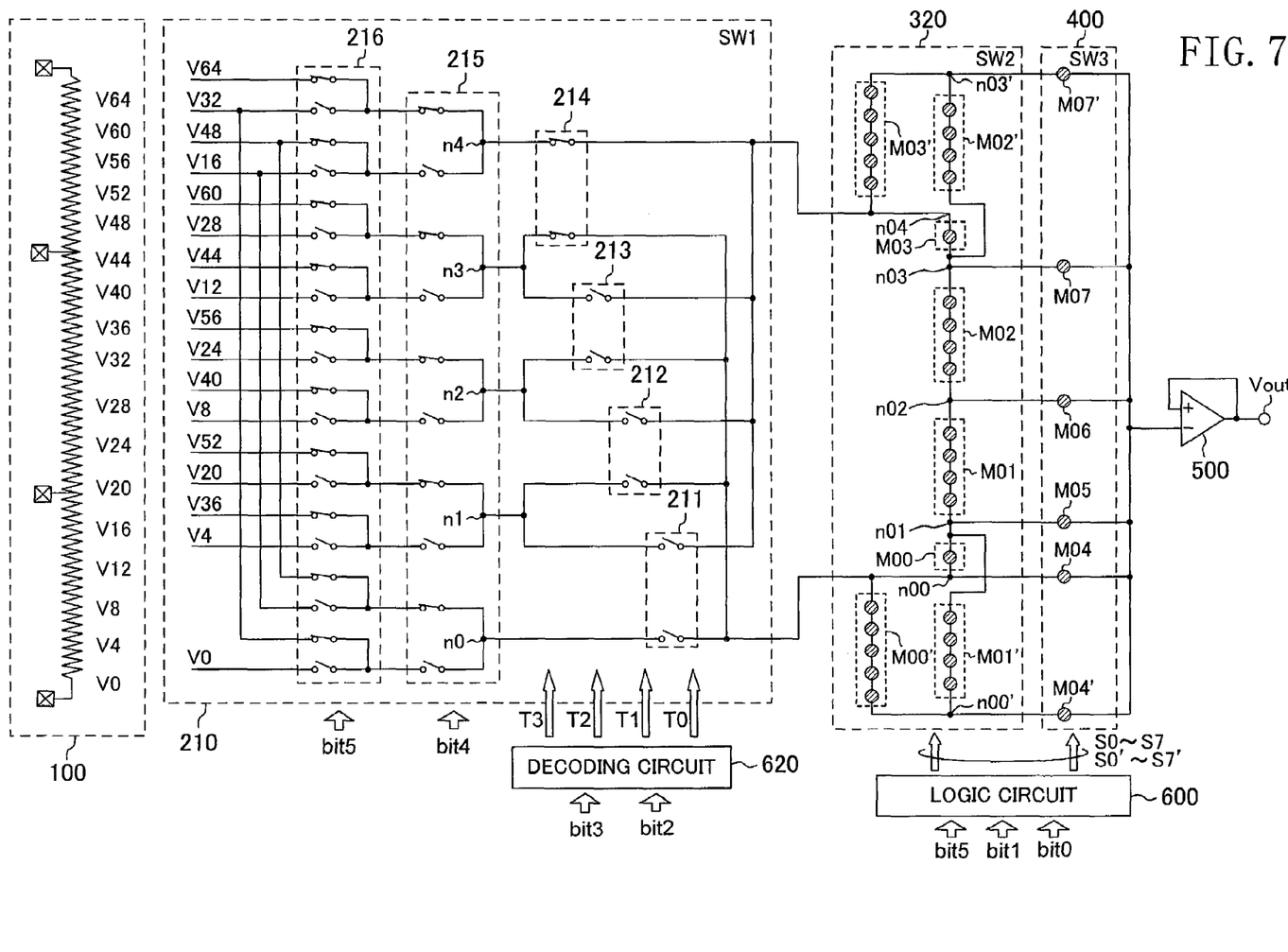
FIG. 7 is a circuit diagram showing still another exemplary configuration of the DAC of the present invention.

FIG. 7 shows another exemplary configuration of the DAC of the present invention. The DAC of FIG. 7 is a converter for converting a digital signal represented by six bits bit5 to bit0 into an analog signal Vout. The DAC comprises a reference voltage generating circuit 100, a first switch circuit (SW1) 210, a second switch circuit (SW2) 320, a third switch circuit (SW3) 400, a voltage follower 500, a logic circuit 600, and a decoding circuit 620. The DAC is characterized by a configuration of the first switch circuit 210.

The reference voltage generating circuit 100, which has the same configuration as that of FIG. 2, supplies 17 different reference voltages V0, V4, V8, . . . , and V64 to the first switch circuit 210.

Figure 8:
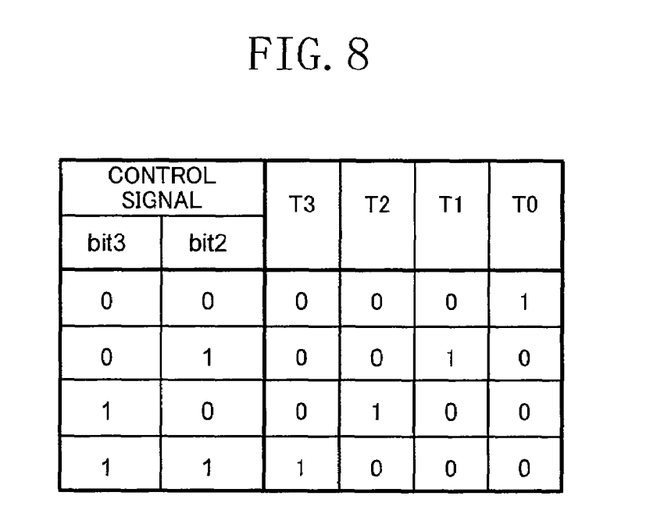
FIG. 8 is a diagram showing an operation of the decoding circuit of FIG. 7.

The decoding circuit 620 decodes the two least significant bits (bit3 and bit2) of the four most significant bits of a 6-bit signal into 4 ($=2^2$) selection signals T3, T2, T1 and T0 any one of which is caused to be valid (logic value: 1). FIG. 8 shows an operation of the decoding circuit 620.

The first switch circuit 210 is a circuit for selecting two adjacent reference voltages (hereinafter the lower is represented by Vin1 and the higher is represented by Vin2) of the 17 reference voltages V0 to V64. The first switch circuit 210 receives the two most significant bits (bit5 and bit4) of the 6-bit signal and the selection signals T3, T2, T1 and T0 from the decoding circuit 620 as a control signal.

211 indicates a switch pair whose ON/OFF is controlled in accordance with T0 and which transfers two inputs (voltages of nodes n0 and n1) to two outputs when T0=1. 212 indicates a switch pair whose ON/OFF is controlled in accordance with T1 and which transfers two inputs (voltages of nodes n1 and n2) to two outputs when T1=1. 213 indicates a switch pair whose ON/OFF is controlled in accordance with T2 and which transfers two inputs (voltages of nodes n2 and n3) to two outputs when T2=1. 214 indicates a switch pair whose ON/OFF is controlled in accordance with T3 and which transfers two inputs (voltages of nodes n3 and n4) to two outputs when T3=1. These 4 ($=2^2$) switch pairs 211 to 214 each selectively transfer two inputs to two outputs in accordance with a corresponding selection signal of the four selection signals T3, T2, T1 and T0 from the decoding circuit 620. In each of the switch pairs 211 to 214, the upper output is connected to a common output and the lower output is connected to another common output. The two common outputs are the two inputs of the second switch circuit 320.

215 indicates 5 ($=2^2+1$) two-input one-output switch pairs whose ON/OFF is controlled in accordance with bit4. The outputs of the five switch pairs 215 are the voltages of the nodes n0, n1, n2, n3 and n4. 216 indicates 10 ($=5 \times 2$) two-input one-output switch pairs whose ON/OFF is controlled in accordance with bit5 and which outputs 10 of the 17 reference voltages V0, V4, V8, . . . , and V64 received from the reference voltage generating circuit 100 to the switch pairs 215. These fifteen switch pairs 215 and 216 each select one of the two inputs in accordance with a corresponding bit of the two most significant bits (bit5 and bit4) of the 6-bit signal, specifically the lower input if the corresponding bit is 0 and the upper input if the corresponding bit is 1.

As described above, the first switch circuit 210 includes nineteen switch pairs 211 to 216.

For example, if the four bits bit5 to bit2 are "0000", the reference voltages V0, V4, V8, V12 and V16 appear at the five nodes n0, n1, n2, n3 and n4 in the first switch circuit 210, respectively. Among them, the lowest reference voltage V0 of the reference voltage generating circuit 100 is connected via 3 ($=6-2-2+1$) MOS transistors to the second switch circuit 320, and the second lowest reference voltage V4 is connected via another three MOS transistors to the second switch circuit 320. In this case, Vin1=V0 and Vin2=V4.

If the four bits bit5 to bit2 are "0001", the reference voltages V0, V4, V8, V12 and V16 appear at the five nodes n0, n1, n2, n3 and n4 in the first switch circuit 210, respectively. Among them, the reference voltage V4 is connected via three MOS transistors to the second switch circuit 320, and the next higher reference voltage V8 is connected via another three MOS transistors to the second switch circuit 320. In this case, Vin1=V4 and Vin2=V8.

If the four bits bit5 to bit2 are "1111", the reference voltages V48, V52, V56, V60 and V64 appear at the five nodes n0, n1, n2, n3 and n4 in the first switch circuit 210, respectively. Among them, the reference voltage V60 is connected via three MOS transistors to the second switch circuit 320, and the highest reference voltage V64 is connected via another three MOS transistors to the second switch circuit 320. In this case, Vin1=V60 and Vin2=V64.

The second switch circuit 320 has a configuration similar to that of the second switch circuit 300 of FIG. 2. Note that, in FIG. 7, the number of MOS transistors M01 connected in series between the node n01 and the node n02 and the number of MOS transistors M02 connected in series between the node n02 and the node n03 are each 4 ($=6-2-2+2$). For example, if the four bits bit5 to bit2 are "0000" and M00, M01, M02 and M03 are all ON, a group of four on-state MOS transistors is interposed between the reference voltage V0 and the node n01, between the node n01 and the node n02, between the node n02 and the node n03, and between the node n03 and the reference voltage V4. The combined ON-resistances of the four MOS transistor groups connected in series divide the difference between V0 and V4 into four, resulting in three intermediate voltages. Note that the MOS transistor group between the reference voltage V0 and the node n01 includes three MOS transistors of the first switch circuit 210, and the MOS transistor group between the node n03 and the reference voltage V4 includes another three MOS transistors of the first switch circuit 210.

Also, in FIG. 7, the number of the MOS transistors M00' connected in series between the node n00 and the node n00' and the number of the MOS transistors M03' connected in series between the node n03' and the node n04 are each 5 ($=6-2-2+3$). The number of the MOS transistors M01' connected in series between the node n00' and the node n01 and the number of the MOS transistors M02' connected in series between the node n03 and the node n03' are each 4 (=6−2−2+2). For example, if the four bits bit5 to bit2 are "1111" and M00', M01', M01, M02, M02' and M03' are all ON and M00 and M03 are OFF, a group of eight on-state MOS transistors is interposed between the reference voltage V60 and the node n00', between the node n00' and the node n02, between the node n02 and the node n03', and between the node n03' and the reference voltage V64. The combined ON-resistances of the four MOS transistor groups connected in series divide the difference between V60 and V64 into four, resulting in three intermediate voltages. Note that the MOS transistor group between the reference voltage V60 and the node n00' includes three MOS transistors of the first switch circuit 210, and the MOS transistor group between the node n03' and the reference voltage V64 includes another three MOS transistors of the first switch circuit 210.

The third switch circuit 400, the voltage follower 500 and the logic circuit 600 each have the same configuration as that of FIG. 2. Therefore, the operations of the second and third switch circuits 320 and 400 are similar to those of FIGS. 3 and 4, and the whole operation of the DAC of FIG. 7 is similar to that of FIG. 5.

Note that when the three least significant bits (bit4, bit3 and bit2) of the four most significant bits of the 6-bit signal are decoded by the decoding circuit 620, 8 (=$2^3$) selection signals are obtained. Therefore, eight two-input two-output switch pairs for receiving these respective selection signals and 9 (=$2^3$+1) two-input one-output switch pairs whose ON/OFF is controlled in accordance with bit5 are provided in the first switch circuit 210. Therefore, in the second switch circuit 320, the number of the MOS transistors M01 provided between the node n01 and the node n02 and the number of the MOS transistors M02 provided between the node n02 and the node n03 are each set to be 3 (=6−2−3+2). Also, the number of the MOS transistors M00' provided between the node n00 and the node n00' and the number of the MOS transistors M03' provided between the node n03' and the node n04 are each set to be 4 (=6−2−3+3), and the number of the MOS transistors M01' provided between the node n00' and the node n01 and the number of the MOS transistors M02' provided between the node n03 and the node n03' are each set to be 3 (=6−2−3+2).

When all the four most significant bits (bit5, bit4, bit3 and bit2) of the 6-bit signal are decoded by the decoding circuit 620, 16 (=$2^4$) selection signals are obtained. Therefore, 16 two-input two-output switch pairs for receiving these respective selection signals are provided in the first switch circuit 210. Therefore, in the second switch circuit 320, the number of the MOS transistors M01 provided between the node n01 and the node n02 and the number of the MOS transistors M02 provided between the node n02 and the node n03 are each set to be 2 (=6−2−4+2). Also, the number of the MOS transistors M00' provided between the node n00 and the node n00' and the number of the MOS transistors M03' provided between the node n03' and the node n04 are each set to be 3 (=6−2−4+3), and the number of the MOS transistors M01' provided between the node n00' and the node n01 and the number of the MOS transistors M02' between the node n03 and the node n03' are each set to be 2 (=6−2−4+2).

Figure 9:
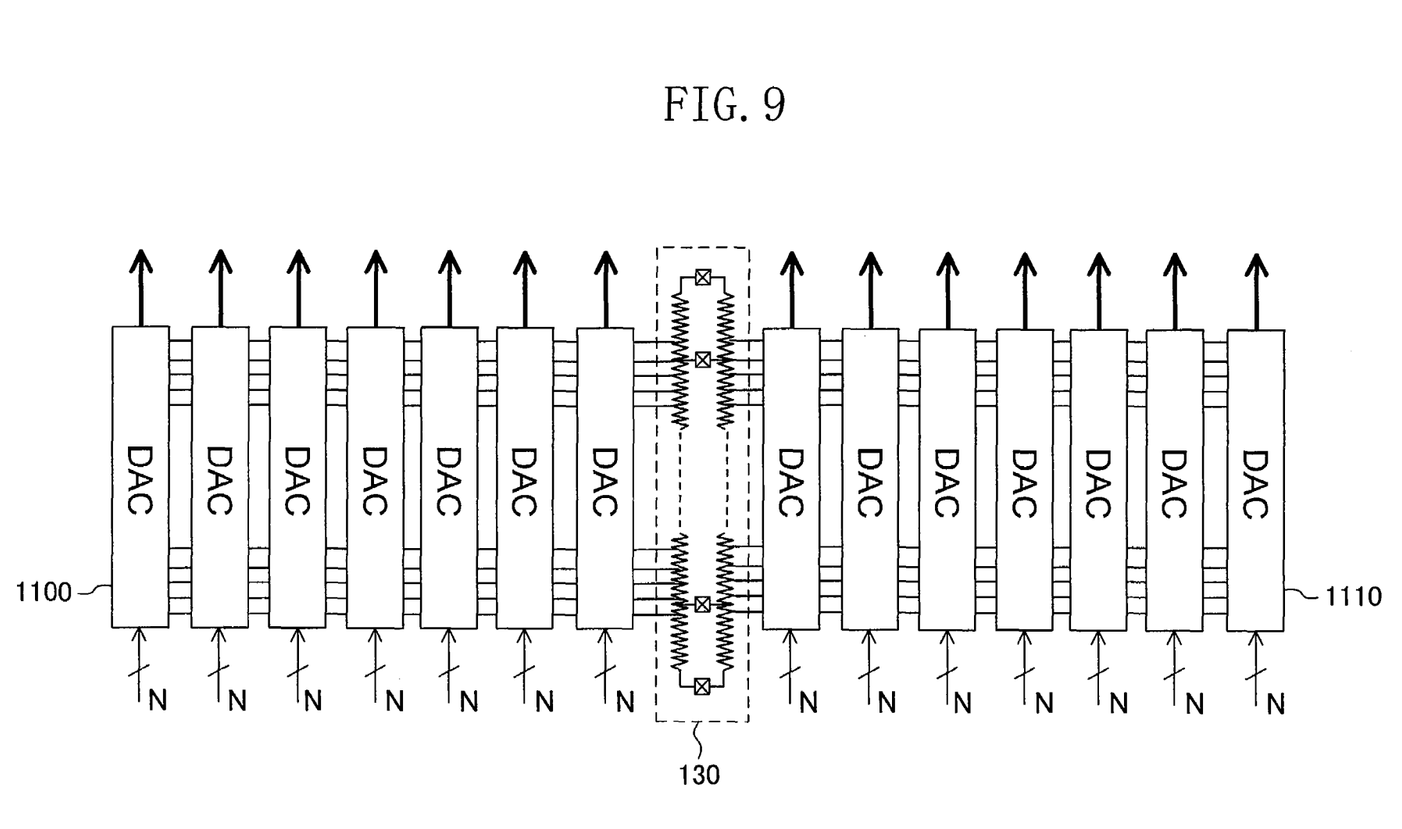
FIG. 9 is a block diagram showing an exemplary configuration of a reference voltage generating circuit in the image display device of FIG. 1.

FIG. 9 shows an exemplary configuration of the reference voltage generating circuit in the image display device 1 of FIG. 1. The reference voltage generating circuit 130 of FIG. 9 has two resistance voltage divider circuits. One of the resistance voltage divider circuits supplies reference voltages to half of all the DACs (DACs 1100), while the other resistance voltage divider circuit supplies reference voltages to the remaining half of the DACs (DACs 1110). By reducing a load of each resistance voltage divider circuit in this manner, variations in the reference voltages can be suppressed. The DACs 1100 and 1110 are each any of the DACs described above. The load reducing effect is large, particularly when a large number of DACs select the same pair of two reference voltages (Vin1 and Vin2 described above).

As described above, according to the DAC of the present invention, the number of elements included therein can be reduced while maintaining the same settling time and the same resolution. The DAC of the present invention is useful not only for a liquid crystal display, but also for an image display device, such as an organic EL display or the like.

What is claimed is:

1. A converter for converting an N-bit digital signal (N is an integer of three or more) into an analog signal using a plurality of different reference voltages, comprising:
   a selection voltage divider circuit having a plurality of MOS transistors each functioning as a switch, wherein the selection voltage divider circuit selects two of the plurality of reference voltages via respective sets of MOS transistors of the plurality of MOS transistors, the sets having the same number of MOS transistors, in accordance with the (N−m) most significant bits of the digital signal, and divides a difference between the two selected reference voltages into M by combined ON-resistances of M MOS transistor groups connected in series of the plurality of MOS transistors to obtain (M−1) intermediate voltages, where m is an integer of one or more and M is an integer of $2^m$ to $2^{m-1}+1$;
   a mode selection circuit for determining a magnitude of the combined ON-resistance of each of the M MOS transistor groups of the selection voltage divider circuit, selecting a first mode when the combined ON-resistance is large and a second mode when the combined ON-resistance is small, and performing a control so that the number of MOS transistors included in each of the M MOS transistor groups in the selection voltage divider circuit is larger in the second mode than in the first mode; and
   an output circuit for selectively outputting one of the two selected reference voltages or one of the (M−1) intermediate voltages as the analog signal in accordance with the m least significant bits of the digital signal.

2. The converter of claim 1, further comprising:
   a reference voltage generating circuit for generating the plurality of reference voltages,
   wherein the reference voltage generating circuit has $2^{N-m}$ resistors connected in series, and supplies ($2^{N-m}$+1) different reference voltages from terminals of the resistors to the selection voltage divider circuit.

3. The converter of claim 1, wherein
   the selection voltage divider circuit has a switch circuit for selecting two adjacent reference voltages from the plurality of reference voltages.

4. The converter of claim 3, wherein
   the switch circuit has a plurality of switch pairs, wherein each of the plurality of switch pairs selects one of two inputs in accordance with a corresponding bit of the (N−m) most significant bits of the digital signal,
   the number $a_n$ of switch pairs corresponding to the n-th bit counted from the least significant bit of the (N−m) most significant bits of the digital signal is represented by:

$$a_1=2,\ a_n=a_{n-1}+2^{n-2}\ (2\leq n\leq N-m),\ \text{and}$$

the two adjacent reference voltages are selected via (N−m) of MOS transistors included in the plurality of switch pairs.

5. The converter of claim 4, wherein each of the M MOS transistor groups in the selection voltage divider circuit has (N−m+1) or more MOS transistors connected in series, and two of the M MOS transistor groups each include the (N−m) MOS transistors for selecting the two adjacent reference voltages, in the (N−m+1) or more MOS transistors connected in series.

6. The converter of claim 3, wherein the selection voltage divider circuit further has a decoding circuit for decoding P least significant bits of the (N−m) most significant bits of the digital signal into $2^P$ selection signals any one of which is valid, where P is an integer of 2 or more and (N−m) or less, the switch circuit has:

$2^P$ switch pairs each for selectively transferring two inputs to two outputs in accordance with a corresponding one of the $2^P$ selection signals; and a plurality of other switch pairs each for selecting one of two inputs in accordance with a corresponding one of the (N−m−P) most significant bits of the digital signal, and the two adjacent reference voltages are each selected via (N−m−P+1) of MOS transistors included in all the switch pairs.

7. The converter of claim 6, wherein each of the M MOS transistor groups of the selection voltage divider circuit has (N−m−P+2) or more MOS transistors connected in series, and two of the M MOS transistor groups each include (N−m−P+1) MOS transistors for selecting the two adjacent reference voltages in the (N−m−P+2) or more MOS transistors connected in series.

8. The converter of claim 1, where the number of MOS transistors included in each of the M MOS transistor groups in the selection voltage divider circuit is set so that combined ON-resistances of the M MOS transistor groups are equal to each other.

9. The converter of claim 1, where the MOS transistors included in each of the M MOS transistor groups in the selection voltage divider circuit each have a size that is set so that combined ON-resistances of the M MOS transistor groups are equal to each other.

10. An image display device comprising a display panel having a plurality of pixels and a drive circuit for driving the plurality of pixels in accordance with a digital signal indicating a gray level of an image, wherein the drive circuit includes:

a reference voltage generating circuit for generating a plurality of different reference voltages; and a plurality of digital-to-analog converters for converting the digital signal indicating the gray level of the image into an analog signal for each pixel column using the plurality of reference voltages, each of the plurality of digital-to-analog converters is the converter of claim 1.

11. The image display device of claim 10, wherein the reference voltage generating circuit has a plurality of resistance voltage divider circuits for sharing a load of supplying reference voltages to a portion of the converters for each pixel column.

* * * * *